May 21, 1957 B. H. ALEXANDER ET AL 2,793,332
SEMICONDUCTOR RECTIFYING CONNECTIONS AND METHODS
Filed April 14, 1953
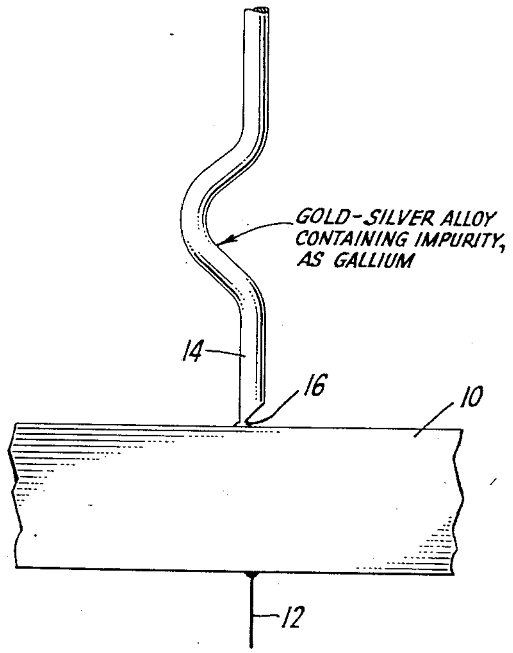
INVENTORS
BEN H. ALEXANDER
ROBERT C. INGRAHAM
BY
Paul S. Martin
ATTORNEY

United States Patent Office 2,793,332

Patented May 21, 1957

2,793,332

SEMICONDUCTOR RECTIFYING CONNECTIONS AND METHODS

Ben H. Alexander, Waltham, and Robert C. Ingraham, Danvers, Mass., assignors to Sylvania Electric Products Inc., a corporation of Massachusetts Application April 14, 1953, Serial No. 348,682

12 Claims. (Cl. 317—239)

The present invention relates to semiconductor devices having rectifying junctions or connections, including both rectifiers as such and semiconductor devices incorporating plural interacting rectifying junctions or connections, and to novel methods of manufacturing semiconductor translators and transducers.

Rectifiers have been extensively employed of the type in which a germanium or silicon wafer or crystal has one relatively large ohmic connection and a sharp-ended wire or contact in pressure engagement with the crystal to provide a rectifying contact. In such rectifiers, the unit area pressure is intense and a very high current density exists at the rectifying contact. However, the rectified current has generally been relatively low, typically 5.0 milliamperes at a 1.0− volt drop in the rectifier.

In order to increase current carrying capacity, resort has been made to the so-called area type of rectifiers having nominal unit-area pressure, in many respects being comparable to copper oxide and selenium rectifiers. Generally, area rectifying junctions have been produced in germanium area rectifiers by relatively slow and critical techniques, such as by diffusion, or by growing a unitary crystal from a melt which periodically is changed in type of impurity content to effect P–N reversals. Experience in fabricating semiconductor devices has indicated the techniques followed in forming point contacts are somewhat simpler in routine production than those employed in conjunction with the formation of area contacts.

In accordance with the present invention, it has been found possible to utilize the techniques customary in fabricating rectifying point-contacts for the purpose of manufacturing high-current rectifying junctions. Specifically, we have found that rectifying junctions or barriers can be formed by bonding a contact element of an inert alloy containing an active impurity to a semiconductor crystal, particularly a conventionally prepared wafer from a crystal of high-back-voltage germanium; but either high or low resistivity germanium may be superior in dependence on the application. The alloy provides a relatively stiff resilient contact and forms a triple eutectic with the crystal that has a relatively low melting point. These factors are believed to be instrumental in achieving excellent characteristics, both as to forward current and efficiency. For purposes of this disclosure an inert alloy is defined as one which contains multiple materials that are substantially ineffective to impart a conductivity type to semiconductive germanium or silicon, where any slight tendency of even large proportions of such materials to influence the conductivity type is completely overcome by even a small percentage of the active impurity.

Advantageously, bonding of the contact material to the semiconductor is accomplished by pulsing the assembly, thereby elevating the temperature sufficiently to alloy the inactive contact alloy with the semiconductor and to carry the active impurity into the alloy thus formed.

As a further feature of the invention, the inert material for the contact material is a gold-silver composition containing the conductivity-type determining material. The gold-silver alloy is believed to form a ternary eutectic with the crystal having a lower melting point than comparable contact alloys suited to hold the active impurity against the crystal for alloying. Accordingly, when pulsing at the energy levels heretofore employed, the same amount of heating is effective to cause more extensive melting and alloying of the active impurity with corresponding advantages in the speed of processing and the ability to obtain prescribed penetrations. Although the internal physical effects are not fully understood, it is thought that the semiconductor dissolves into the contact alloy to some extent during pulsing, carrying the controlling impurity into the alloy formed with the semiconductor and converting the alloyed semiconductor to the opposite type of conductivity from the bulk of the semiconductor body.

Indium and gallium are prominently effective in conductivity-type determining metals in conjunction with the relatively low-melting gold-silver alloy to form rectifying connections on germanium initially of N-type semiconductor. Antimony and arsenic are similarly effective as conductivity-type determining materials for P-type germanium, not only in the production of diodes as such, but also in the production of so-called area-junction semiconductor transistors, where multiple junctions are formed close to each other in addition to a low resistance ohmic connection to the semiconductor. A feature of the present invention is the control that can be realized over the form and dimensions of junction transistors, formed of a semiconductor wafer having closely spaced rectifying junctions on a surface of the semiconductor or on its opposite sides.

It is significant that semiconductor rectifiers fabricated in accordance with the present invention have improved electrical characteristics. For example, when using an alloyed contact of silver and gold in equal parts with one percent gallium pulsed at 50 volts A. C. on N-type germanium having a resistivity of the order of 20 ohm-centimeters, 60 milliamperes in the forward direction at one volt is readily obtainable and this high forward conduction is maintained at low leakage and at high peak back voltage, as low as 450 microamperes at back voltages of minus 250 volts D. C.

The nature of the invention, and further features and advantages will be best appreciated by reference to the following detailed disclosure, when taken in conjunction with the accompanying illustrative drawings, wherein:

The single figure is a diagrammatic illustration of a rectifier embodying features of the present invention and fabricated in accordance with the present process.

Germanium suitable for the purpose of the present invention is highly purified and processed by techniques well known in the art. The desirable purity is estimated in parts of impurity content per million, and for single-crystal germanium, high purity desired for certain rectifying characteristics is represented by high resistivity, e. g., 20 ohm-centimeters. Slices of perhaps .018 inch thickness are cut from a "pulled" single crystal of N-type germanium, advantageously plated on one surface for effecting a good electrical area contact, and on the opposite surface the slices are advantageously polished, etched, washed and dried, all in accordance with well known techniques.

A germanium rectifier embodying features of the invention includes a semi-conductor body 10 supported on a metallic low-resistance ohmic contact 12 shown symbolically, and on its opposite side by a contact element 14. The contact element 14 is bonded or alloyed to the semiconductor body 10 at a rectifying junction or connection 16. The contact element is fabricated of an alloy containing multiple substantially inert materials, containing an active impurity effective to determine conductivity type in the semiconductor material. A highly effective inert or inactive alloy has been found to be binary composition of silver and gold to which has been added an element of group III of the periodic table of elements, preferably of the group consisting of gallium and indium, where body 10 is of N-type germanium. Exceptionally good conductivity in the forward direction has been observed with a contact member 14 of an alloy having equal parts of silver and gold and approximately 1% gallium. It is to be noted that the contact member 14, which when welded or bonded to the germanium body 10 provides an area rectifying connection 16. The contact wire is relatively stiff and, when formed as a conventionally contoured spring, applies sustained pressure engagement with body 10 during formation of the bonded contact to the crystalline semiconductor 10, and the stiff alloy wire serves also as a vehicle or carrier that is effective to apply the active impurity to the semiconductor body.

Bonding or alloying of the contact member 14 to the germanium body 10 in the region of the rectifying connection 16 is effectively accomplished by interconnecting a suitable pulsing supply between the contact member 14 and the metallic ohmic contact 12. The expedient of pulsing a semiconductor is well known for enhancing rectification. Here, however, the pulsing is relied upon to alloy the contact member 14 to the semiconductor body with a corresponding formation of a rectifying connection or junction 16 contiguous to the wire alloy area, presumably forming a ternary eutectic of gold, silver and germanium. On this basis, the amount of heating evolved incident to pulsing is effective to form an efficient rectifying alloy in the region of the rectifying connection 16.

Excellent rectifiers have been formed in the manner above described using N-type germanium of relatively high resistivity in conjunction with a contact member of a binary alloy of silver and gold in equal parts, additionally containing 1% of gallium. Gallium is effective to impart P-type properties to germanium, so that a P–N junction is formed upon alloying of the contact member with the germanium. In an example, using germanium of approximately 20 ohm-centimeters resistivity, pulsed at approximately 50 volts A. C. for just short of one second, forward conductivity is obtainable of the order of 60 milliamperes with one volt applied in the forward direction. Corresponding reverse characteristics are: 2 to 6 microamperes at minus 10 volts; 40 microamperes at minus 100 volts; 300 microamperes at minus 200 volts and 450 microamperes at 250 volts. These results indicate that much higher peak back voltages can be expected with the rectifiers as fabricated in accordance with the techniques of the present invention, without loss of forward conduction. It is to be further noted that high forward conductivity is realized even with low leakage or back currents. If rectification ratio is taken as the ratio of back resistance to forward resistance, and if the resistances considered are at 1.0 volt in the forward direction and at 200 volts in the back direction, the high figure of 40,000 is obtained.

The unit illustrated is very useful as a rectifier but it will be further apparent that a further rectifying contact may be applied to the germanium wafer 10, close to the rectifying connection 16, either on the same side of the wafer or on the opposite side thereof. If rectifying contacts on opposite sides of the wafer are used, the ohmic connection 12 would be applied to the slice elsewhere. Of course, in this type of construction, a critical thickness of the germanium slice 10 would be used. The invention has been described in conjunction with germanium, but silicon which is also a diamond cubic crystal and similarly affected by the same donor and acceptor impurities is a broad equivalent for germanium. In lieu of using the group III metals as would be required in conjunction with N-type semiconductor materials of group IV, it is equally within the contemplation of the present invention to use group V materials in alloy contacts applied to P-type semi-conductors of group IV.

From the foregoing illustrative disclosure, various substitutions, modifications, and further applications, will be apparent to those skilled in the art. It is therefore appropriate that the appended claims be accorded that latitude of interpretation that is consistent with the spirit and scope of the invention.

What is claimed is:

1. A rectifier including a semiconductor body of N-type conductivity, and a bonded contact primarily of a gold-silver alloy containing also smaller amounts of a metal of group III chosen from the group consisting of indium and gallium.

2. A rectifier including a germanium body of N-type conductivity, and a contact element of an alloy containing gold, silver, and indium bonded to said germanium.

3. A rectifier including a germanium body of N-type conductivity, and a contact element of an alloy containing gold, silver and gallium bonded to said germanium body.

4. A rectifying junction including a germanium body of N-type conductivity, and a bonded contact of an alloy containing gold and silver in equal parts with approximately one percent of gallium.

5. A semiconductor device including germanium of N-type conductivity having a bonded contact on at least one face thereof, said contact being primarily of an alloy of gold and silver with smaller amounts of a metal of group III chosen from the group consisting of indium and gallium.

6. A semiconductor device including a germanium body of one conductivity type, and a contact element welded to said body at a rectifying connection, said contact element containing primarily gold, silver, and lesser amounts of a material capable of imparting the opposite conductivity to said germanium body, said gold and silver forming a ternary eutectic with said germanium body at said rectifying connection.

7. An electrical device including a germanium body of one conductivity type, and a conductive wire formed primarily of a gold-silver alloy together with lesser amounts of a material capable of imparting the opposite conductivity type to said germanium body, said conductive wire being in endwise pressure engagement with said germanium body and bonded thereto at a rectifying connection.

8. The method of forming a rectifiyng connection in a semiconductor of one conductivity type comprising the steps of contacting a gold-silver alloy containing a limited quantity of material capable of imparting the opposite conductivity type to the semiconductor against the semiconductor, and pulsing the assembly at an energy level sufficient to elevate the temperature in the contact region above the melting point of the eutectic alloy of gold, silver and the semiconductor and for a period sufficient to alloy to a limited depth with the semiconductor forming a eutectic region of opposite conductivity.

9. The method of making a rectifying connection including the steps of assembling a semiconductor of one conductivity type in engagement with a contact element of an alloy of gold, silver, and a limited quantity of material capable of imparting the opposite conductivity type to the semiconductor, and passing a current through said assembly in an amount sufficient to alloy the contact element to the semiconductor thereby to form a eutectic region of opposite conductivity.

10. A rectifier including a semiconductor body of N-type conductivity and a bonded contact of a gold-silver alloy containing a metal of group III chosen from the group consisting of indium and gallium.

11. A semiconductor device including germanium of N-type conductivity having a bonded contact on at least one face thereof, said contact being an alloy of gold and silver with a metal of group III chosen from the group consisting of indium and gallium.

12. A rectifier including a semiconductor body of N-type conductivity, and a bonded contact formed from an alloy consisting primarily of gold and silver containing in addition trace amounts of conductivity controlling material chosen from the group consisting of indium and gallium.

References Cited in the file of this patent

UNITED STATES PATENTS

| | | |
|---|---|---|
| 1,062,641 | Einfeldt | May 27, 1913 |
| 2,279,316 | Herzog | Apr. 14, 1942 |
| 2,316,579 | Kershaw | Apr. 13, 1943 |
| 2,447,829 | Whaley | Aug. 24, 1948 |
| 2,583,009 | Olsen | Jan. 22, 1952 |
| 2,646,536 | Benzer et al. | July 21, 1953 |
| 2,653,374 | Mathews et al. | Sept. 29, 1953 |
| 2,654,059 | Shockley | Sept. 29, 1953 |
| 2,671,156 | Douglas et al. | Mar. 2, 1954 |
| 2,680,220 | Starr et al. | June 1, 1954 |
| 2,697,269 | Fuller | Dec. 21, 1954 |